(12) United States Patent
Hoefler et al.

(10) Patent No.: US 7,115,949 B2
(45) Date of Patent: Oct. 3, 2006

(54) METHOD OF FORMING A SEMICONDUCTOR DEVICE IN A SEMICONDUCTOR LAYER AND STRUCTURE THEREOF

(75) Inventors: Alexander Hoefler, Austin, TX (US); Chi Nan Brian Li, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 181 days.

(21) Appl. No.: 10/158,692

(22) Filed: May 30, 2002

(65) Prior Publication Data

US 2003/0222306 A1  Dec. 4, 2003

(51) Int. Cl.
 *H01L 29/72* (2006.01)
(52) U.S. Cl. .................. 257/350; 257/347; 257/377; 257/314; 257/315; 257/E29.17
(58) Field of Classification Search ........ 257/377, 257/314, 315, 347, 350, E29.17
See application file for complete search history.

(56) References Cited

U.S. PATENT DOCUMENTS

| | | | | |
|---|---|---|---|---|
| 4,797,721 A | * | 1/1989 | Hsu | 257/354 |
| 5,124,276 A | * | 6/1992 | Samata et al. | 438/607 |
| 5,137,837 A | | 8/1992 | Chang et al. | |
| 5,691,552 A | * | 11/1997 | Oyama | 257/316 |
| 5,693,974 A | * | 12/1997 | Hsu et al. | 257/369 |
| 5,780,891 A | * | 7/1998 | Kauffman et al. | 257/316 |
| 5,852,306 A | * | 12/1998 | Forbes | 257/315 |
| 6,005,270 A | * | 12/1999 | Noguchi | 257/315 |
| 6,013,928 A | * | 1/2000 | Yamazaki et al. | 257/347 |
| 6,144,079 A | | 11/2000 | Shirahata et al. | |
| 6,314,021 B1 | | 11/2001 | Maeda et al. | |
| 6,452,233 B1 | * | 9/2002 | Masuda | 257/349 |
| 6,461,984 B1 | * | 10/2002 | Han et al. | 438/788 |
| 6,608,345 B1 | * | 8/2003 | Kunikiyo et al. | 257/314 |
| 6,633,070 B1 | * | 10/2003 | Miura et al. | 257/377 |
| 6,919,236 B1 | * | 7/2005 | Wei et al. | 438/149 |

FOREIGN PATENT DOCUMENTS

EP          0 373 893 A2      12/1989

OTHER PUBLICATIONS

Hokazono et al., "Source/Drain Engineering for a Sub-100 nm CMOS Using Selective Epitaxial Growth Technique," IEEE, pp. 10.6.1-10.6.3 (2000).
Burnett et al., "An Advanced Flash Memory Technology on SOI," IEEE, pp. 36.4.1-36.4.4 (1998).
PCT 03/15796 International Search Report May 28, 2004.

* cited by examiner

*Primary Examiner*—Eugene Lee
(74) *Attorney, Agent, or Firm*—Kim-Marie Vo

(57) ABSTRACT

In some embodiments, non-volatile memory (NVM) devices are formed on a silicon-on-insulator (SOI) substrate (12) by forming elevated sources and drains (56) in contact with extensions (46) within the top silicon layer (18) of the SOI substrate (12). Buried conductive regions (42) are formed within the top silicon layer (18) below the extensions (46) to mitigate floating body effects that occur when using SOI substrates. In other embodiments, NVM devices are formed using elevated sources and drains (56), extensions (46) and the buried conductive regions (42) in bulk semiconductor substrates. In any embodiment, logic devices may be formed in conjunction with NVM devices, wherein the logic and NVM devices have elevated sources and drains (56), extensions (46) and the buried conductive regions (42).

12 Claims, 6 Drawing Sheets

METHOD OF FORMING A SEMICONDUCTOR DEVICE IN A SEMICONDUCTOR LAYER AND STRUCTURE THEREOF

RELATED APPLICATION

This application is related to U.S. patent application Ser. No. 09/845,117 filed Apr. 30, 2001, entitled "Non-Volatile Memory With A Serial Transistor Structure With Isolated Well And Method Of Operation" and assigned to the current assignee hereof and patent application Ser. No. 09/639,195, filed Aug. 15, 2000, entitled "Non-Volatile Memory, Method of Manufacture, And Method of Programming," and assigned to the current assignee hereof.

FIELD OF THE INVENTION

This invention relates generally to semiconductor devices, and more specifically, to conductive regions of semiconductor devices.

BACKGROUND OF THE INVENTION

Silicon-on-insulator (SOI) technology has been developed to provide a number of advantages over bulk silicon device technologies. As is known, SOI provides improvements in speed and power consumption with respect to previous bulk silicon circuits. Some of the benefits of SOI technology are based on the reduced capacitance at various junctions within semiconductor devices. One problem with SOI technology is the floating body effect, which increases the number of holes in the channel region of the semiconductor device. This increase of holes can lead to an undesirable phenomenon known as "snap-back", which is a substantial increase in the current of the semiconductor device that can ultimately lead to destruction of the semiconductor device.

Unlike in bulk silicon, in SOI substrates the holes in the channel region cannot be dispersed through the top semiconductor layer or through a contact to the top semiconductor layer. In SOI substrates, the buried insulating layer and the source and drain regions, which extend from the top surface of the top silicon layer in the SOI substrate to the buried insulating layer in the SOI substrate, isolate the holes so that they cannot combine with electrons present in other areas of the SOI substrate. Although the floating body effect is undesirable for all semiconductor devices, it is especially problematic for nonvolatile memory (NVM) devices. For example, when trying to program an NVM device, the floating body effect inhibits controlling the bias on the body region of the NVM device, thus making the programming of the NVM device difficult.

In addition to the floating body effect, problems with trying to erase an NVM device must also be overcome when implementing an NVM device on an SOI substrate. When erasing an NVM device it is necessary to electrically contact the well in order to apply a voltage (i.e. bias the well). However, in SOI substrates the well is formed in the buried insulating layer and therefore is isolated and cannot be biased. In addition, it is desirable to contact the bottom semiconductor layer of the SOI substrate when erasing (and programming) NVM devices to apply voltages to a control gate and the bottom semiconductor substrate because applying a voltage only to the control gate undesirably increases the voltage needed. However, contacting the bottom semiconductor substrate when using an SOI substrate is only possible if a conductive region that extends from the top semiconductor layer to the bottom semiconductor layer via the buried insulating layer is formed. Forming such a conductive region severely increases the size of the NVM bit cell (i.e. the NVM device and associated circuitry).

One proposed solution for forming an NVM device on an SOI substrate is a DiNOR (Divided bit line NOR) device, which extends either the source or drain region farther underneath the channel region compared to the corresponding source or drain region, respectively. Due to the asymmetry of the source and drain regions, certain low power operation schemes such as uniform channel programming or hot carrier injection (HCI) cannot be performed effectively on the DiNOR device. In addition, the DiNOR device cannot easily be scaled because as the channel region of the NVM device shrinks the source and drain regions are brought closer together, resulting in severe short channel effects. Therefore, a need exists for a scalable NVM device formed on an SOI substrate that can be erased and programmed under low power operation schemes and is scalable.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment, elevated source and drain regions are formed as part of a logic device and a non-volatile memory (NVM) device on a semiconductor substrate. In another embodiment, the NVM device is formed on a semiconductor substrate without a logic device. The NVM device and logic device, if present, has a source region, a drain region and extension regions below the source region and the drain region in a semiconductor layer of the semiconductor substrate. In a preferred embodiment, the semiconductor layer is the top layer of a silicon-on-insulator (SOI) substrate. At least the NVM device includes the elevated source and drain regions and buried conductive regions below the extension regions. The buried conductive regions have a conductivity opposite that of the elevated source and drain regions.

Figure 1:
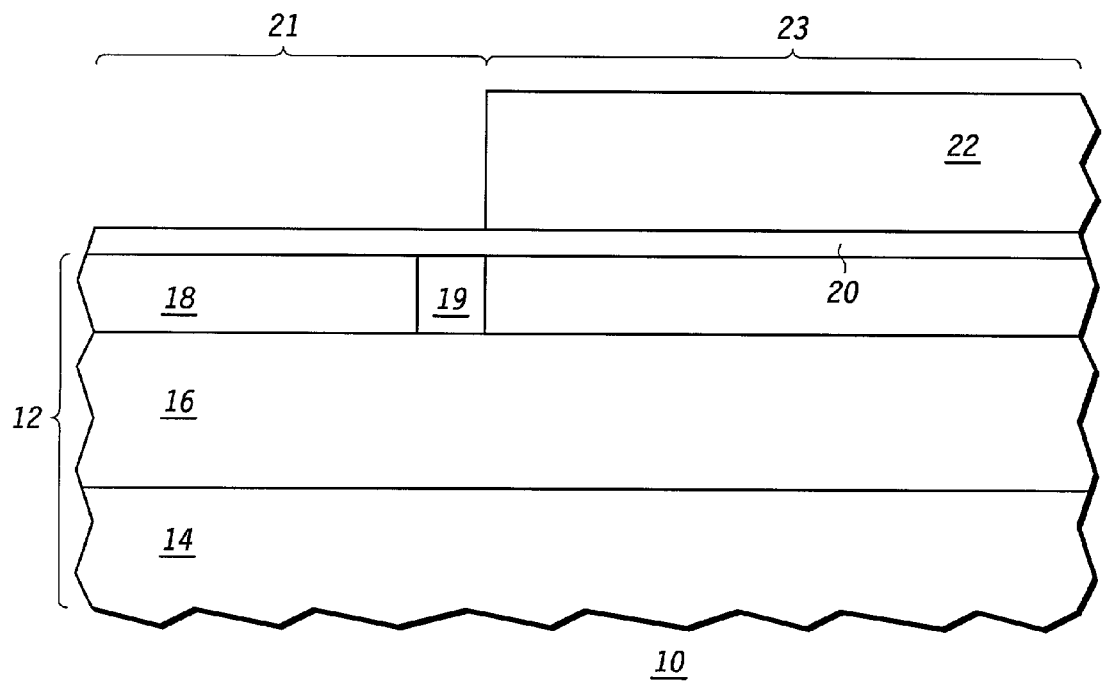
FIGS. 1–5 illustrate a cross-sectional view of a gate stack and memory stacks being formed on a semiconductor substrate in accordance with an embodiment of the present invention.

FIG. 1 illustrates a semiconductor device 10 including a semiconductor substrate 12, a tunnel dielectric layer 20, and a first patterned photoresist layer 22 formed over the tunnel dielectric layer 20. In a preferred embodiment, the semiconductor substrate 12 is an SOI substrate having a bottom silicon layer 14, a buried insulating layer 16 and a top semiconductor layer 18. In a preferred embodiment, the top semiconductor layer 18 is a silicon substrate that is lightly doped p-type (e.g. the silicon substrate has been doped with a p-type species, such as boron, at a doping concentration of about $1 \times 10^{15}$ atoms/cm$^2$). However, the semiconductor substrate 12 can be any semiconductor containing substrate such as silicon, silicon germanium, silicon-on-sapphire, the like, or combinations thereof.

As shown in FIG. 1, an isolation region 19 is formed in the top silicon layer 18 to electrically isolate a logic region 21, which is where at least one logic device will be formed, from an NVM region 23, which is where at least one NVM device will be formed, on the semiconductor substrate 12. In one embodiment, the isolation region 19 is a trench (not shown) etched in the top silicon layer 18 and filled with silicon dioxide. The silicon dioxide can be formed by chemical vapor depositing a silicon dioxide layer over the semiconductor substrate 12 and subsequently chemical mechanically polishing the silicon dioxide layer to planarize the silicon dioxide layer and to remove portions of the silicon dioxide layer that are not within the trench.

Figure 2:
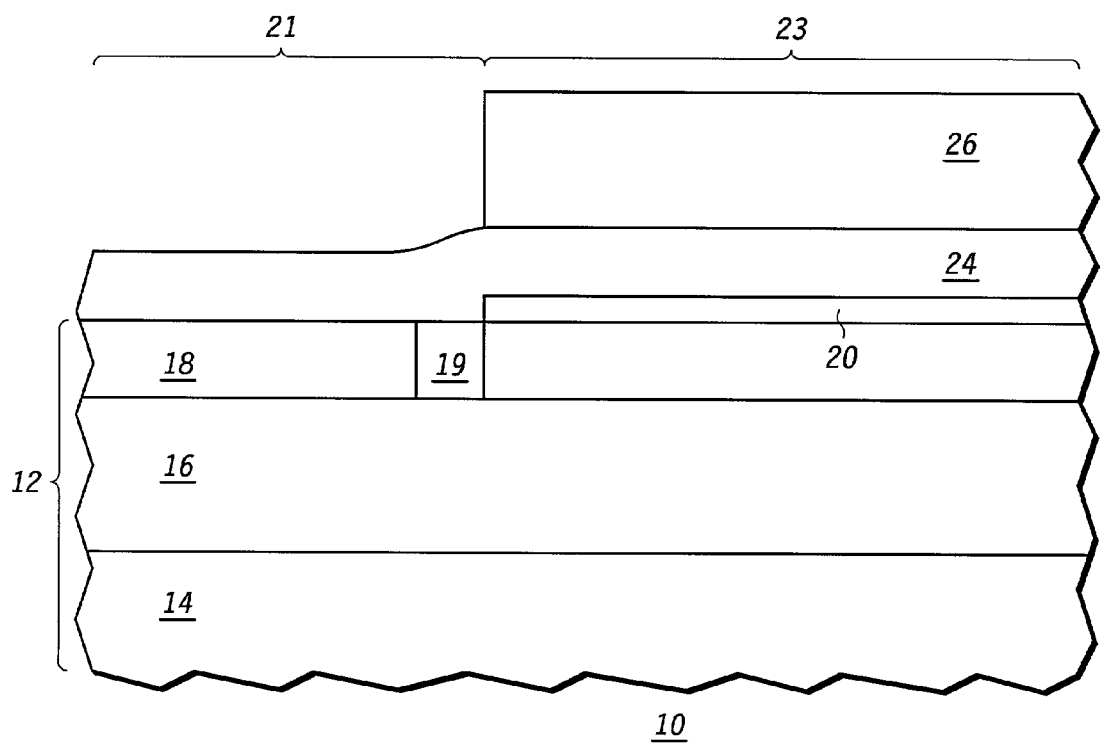

The tunnel dielectric layer 20 is formed over the semiconductor substrate by chemical vapor deposition (CVD), physical vapor deposition (PVD), atomic layer deposition (ALD), thermal oxidation, the like or combinations of the above. The first photoresist layer 22 is deposited and patterned using conventional processing to pattern the tunnel dielectric layer 20 in a subsequent etch process, also conventional, so that the tunnel dielectric layer 20 is removed in the logic region 21 and remains in the NVM region 23 to become part of an NVM device (as shown in FIG. 2). Generally, the tunnel dielectric layer 20 will be approximately 1–13 nanometers of silicon dioxide. Additionally, the tunnel dielectric layer 20 can be any insulating material, such as a metal oxide (e.g. HfO$_2$), a nitride, or an oxynitride.

After patterning the tunnel dielectric layer 20, a charge storage layer 24 is formed over the semiconductor substrate and the tunnel dielectric 20 by CVD, PVD, ALD, the like or combinations of the above. As shown in FIG. 2, a second patterned photoresist layer 26 is formed over the charge storage layer 24 to pattern the charge storage layer 24 by etching so that the charge storage layer 24 remains only in the NVM region 23 of the semiconductor device 10. In one embodiment, the charge storage layer is approximately 4–25 nanometers of a nitride containing material, such as silicon nitride. In another embodiment, the charge storage layer 24 is 40–250 nanometers of a conductive material, such as polysilicon, and will become a floating gate in the completed NVM device, which is termed a floating gate device. In yet another embodiment, a nanocrystal NVM device is formed when the charge storage layer 24 is a plurality of nanocrystals (discrete storage elements).

Figure 3:
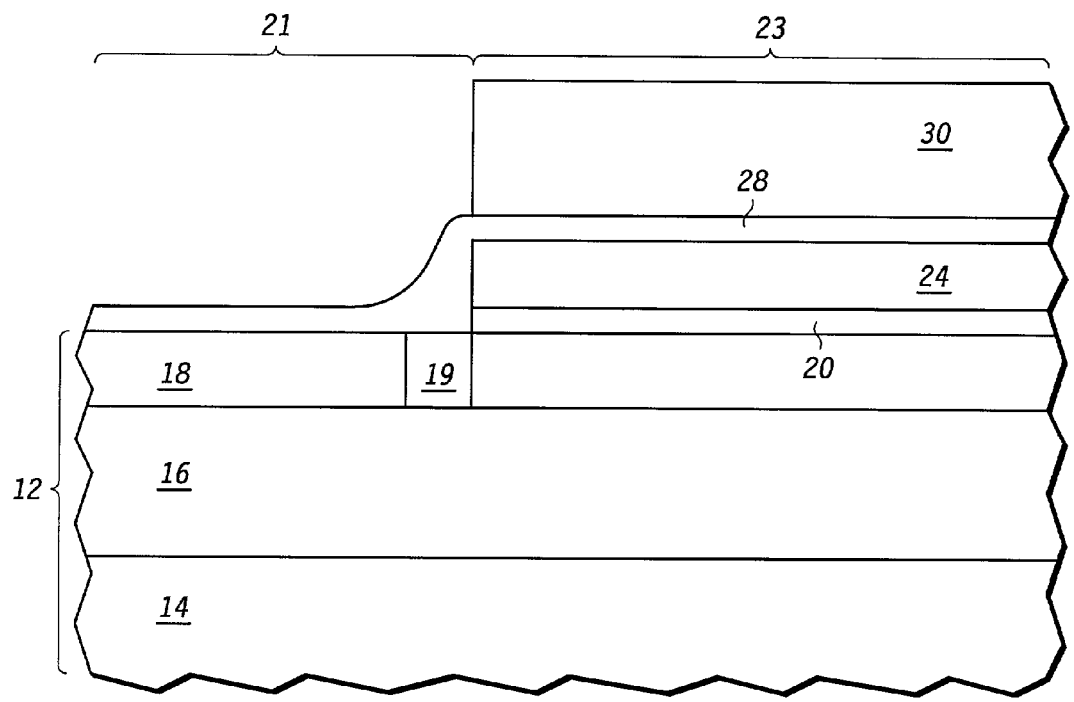

A control dielectric layer 28 (see FIG. 3) is then formed over the semiconductor substrate 12 in both the logic region 21 and the NVM region 23 by CVD, PVD, ALD, thermal oxidation, the like, or combinations of the above after removing the charge storage layer 24 from the logic region 21. A third patterned photoresist layer 30 is formed over the NVM region 23, as shown in FIG. 3, and is used to etch the control dielectric layer 28 so that the control dielectric layer 28 remains in the NVM region 23. The control dielectric layer 28 is optional and may not be formed in all NVM devices. For example, semiconductor-nitride-oxide-semiconductor (SNOS) or metal-nitride-oxide-semiconductor (MNOS) NVM devices do not have a control dielectric layer 28 formed over the charge storage layer 24, which is a nitride-containing material. However, semiconductor-oxide-nitride-oxide-semiconductor (SONOS) or metal-oxide-nitride-oxide-semiconductor (MONOS), floating gate devices and nanocrystal NVM devices have a control dielectric layer 28. In a floating gate device, the control dielectric layer 28 can be any insulator and, preferably, is a stack of a oxide-nitride-oxide (ONO) that has an effective oxide thickness of 5–20 nanometers, meaning its dielectric property is electrically equivalent to 5–20 nanometers of silicon dioxide. In general, for any NVM device the control dielectric layer 28 can be 0 to 25 nanometers of any insulating material, such as silicon dioxide or a metal oxide (e.g. HfO$_2$).

Figure 4:
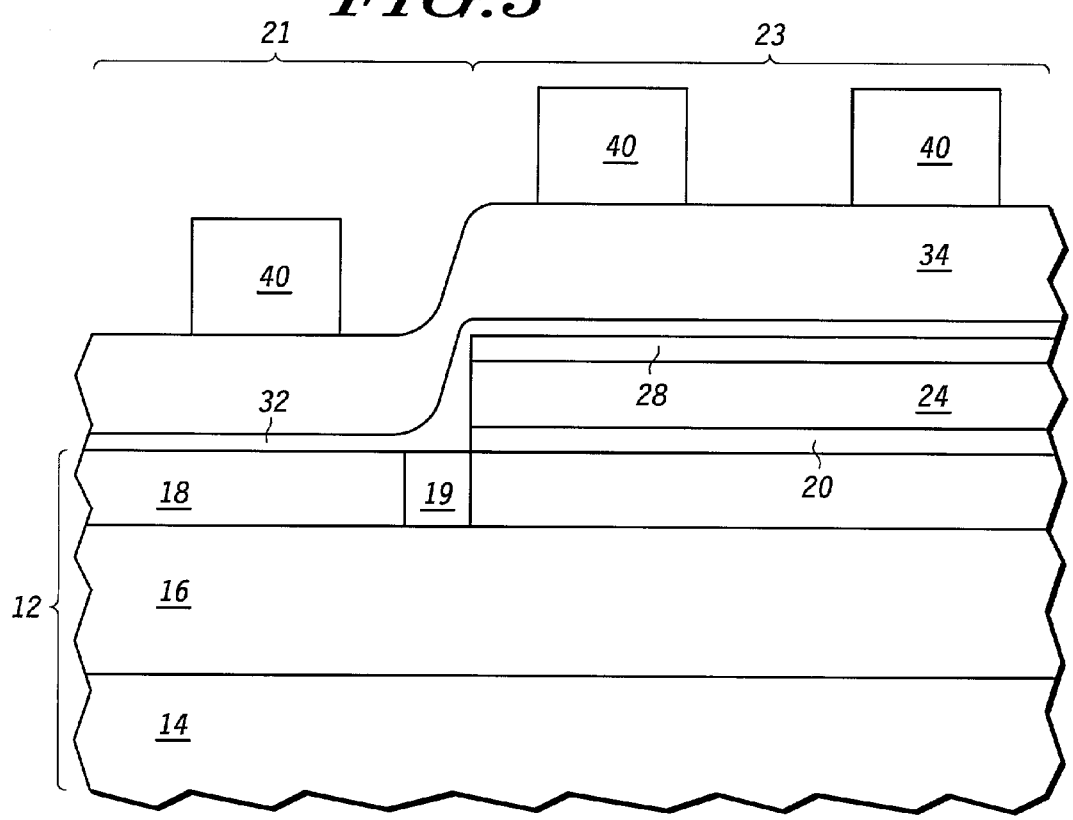

Shown in FIG. 4, after patterning the optional control dielectric layer 28, a gate dielectric layer 32, a conductive layer 34, and a fourth patterned photoresist layer 40 are formed over the semiconductor substrate 12. The gate dielectric layer 32 is formed on the top semiconductor layer 18 in the logic region 21 and on the control dielectric layer 28, if present, in the NVM region 23 or on the charge storage layer 24 if the control dielectric layer 28 is not present. The gate dielectric 32 can be any insulating material, such as silicon dioxide, a metal oxide (e.g. HfO$_2$), a high dielectric constant material (e.g. HfO$_2$ and ZrO$_2$), the like, or combinations of the above. An optional etching (not shown) of the gate dielectric 32 may be performed to remove the gate dielectric layer 32 from the NVM region 23. This is desirable if a SNOS or MNOS device is being formed, since no dielectric or insulating layer should be formed between the charge storage layer 24 (e.g. nitride) and a subsequently formed control electrode (e.g. polysilicon). However, if the control dielectric layer 28 is present, the gate dielectric 32 may remain in the NVM region 23 because the processing sequence can be designed to form a thinner control dielectric layer 28 than desired so that the resulting thickness of the control dielectric layer 28 and the gate dielectric layer 32 in the NVM region 23 is the desired thickness of the control dielectric layer 28. Thus, if the gate dielectric layer 32 is not removed in the NVM region 23 then the control dielectric layer 28 and the gate dielectric layer 32 in the NVM region will together act as a control dielectric layer for the NVM device.

In the illustrated embodiment, separate dielectric layers are formed for the gate dielectric layer 32, which becomes the gate dielectric in the logic device, and the control dielectric layer 28, which becomes the control dielectric in the NVM device, because typically a thinner dielectric layer is desired for the gate dielectric than the control dielectric. However, if the same thickness and material could be used in both the logic region 21 and the NVM region 23, only one dielectric layer needs to be formed. In other words, the gate dielectric layer 32 is not deposited after the control dielectric layer 28 in some embodiments. Instead, a dielectric material is deposited over the logic region 21 and the NVM region 23 and the dielectric material is etched to form a control dielectric in the NVM region and a gate dielectric in the logic region.

After forming and, optionally, patterning the gate dielectric 32, a conductive layer 34 is deposited by PVD, CVD, ALD, the like or combinations of the above. The conductive layer 34 is formed over both the logic region 21 and the NVM region 23 and portions of the conductive layer 34 will remain in each region after being patterned (e.g. etched).

The conductive layer 34 can be any conductive material and preferably is approximately 50–200 nanometers of polysilicon.

Figure 5:
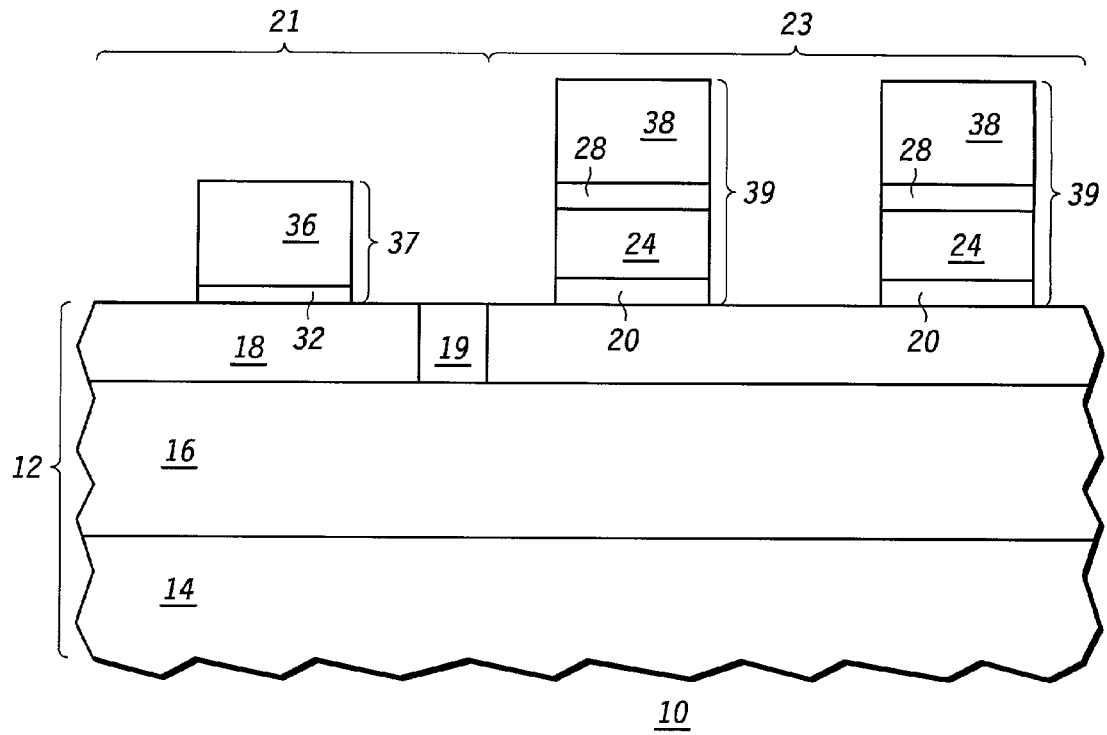

Using the fourth patterned photoresist layer 40, the conductive layer 34 is etched using conventional processes to form a gate electrode 36 in the logic region 21 and control electrodes 38 in the NVM region 23 as shown in FIG. 5. After the conductive layer 34 is patterned, the underlying dielectric layers are etched using conventional processes to form (non-volatile) memory stacks 39 in the NVM region 23 and a logic stack 37 in the logic region 21, as illustrated in FIG. 5. The memory stacks 39 include the control electrodes 38, (optional) control dielectric layers 28, charge storage layers 24 and tunnel dielectric layers 20 and the logic stack 37 includes the gate electrode 36 and the gate dielectric 32. In FIG. 5, the fourth patterned photoresist layer 40 was patterned to form one logic stack 37 and two memory stacks 39. However, a skilled artisan should recognize that any number of logic stacks and memory stacks could be formed simultaneously.

Figure 6:
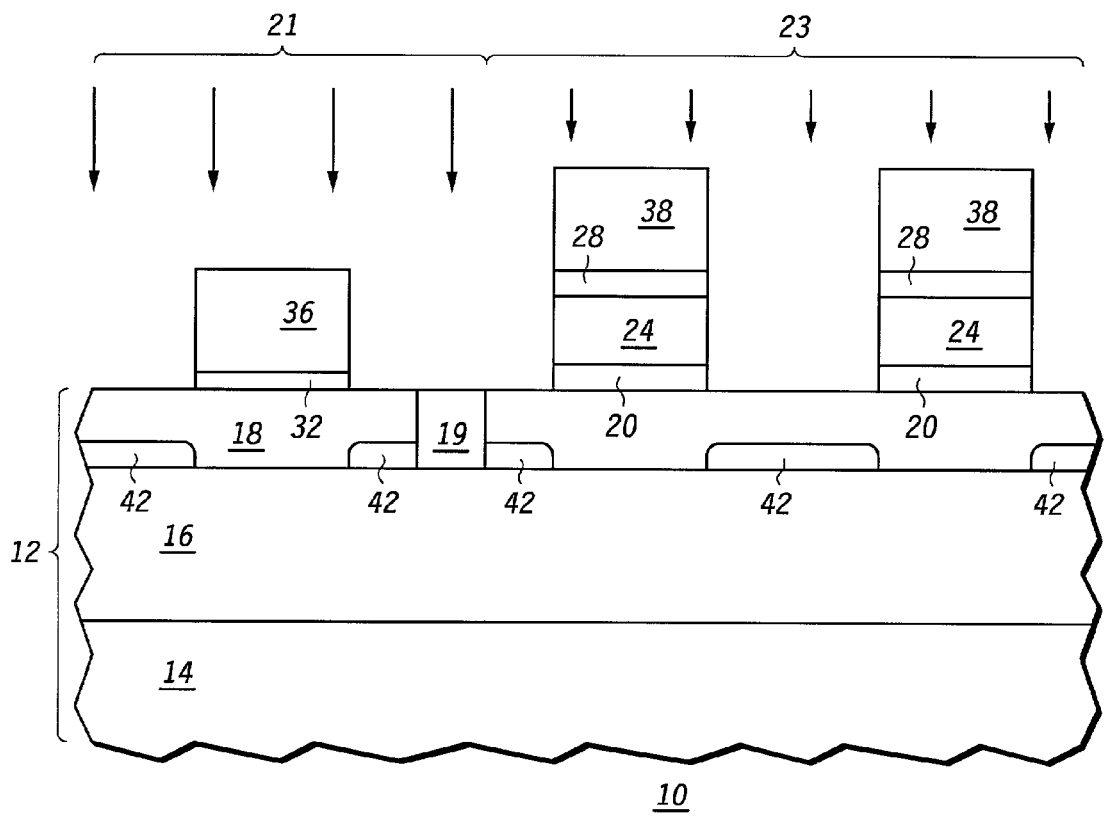
FIGS. 6–7 illustrate the semiconductor substrate of FIG. 5 while forming conductive regions within a semiconductor layer in accordance with an embodiment of the present invention.
Figure 11:
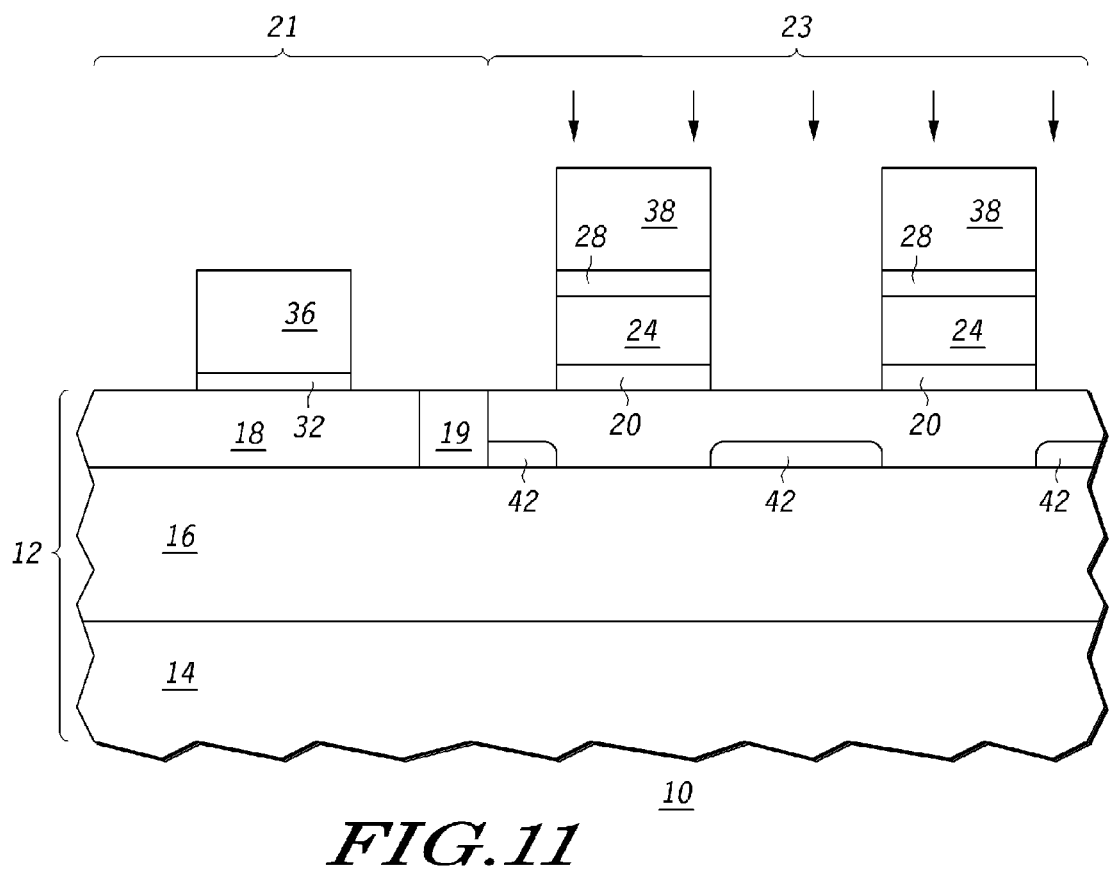
FIG. 11 illustrates a semiconductor substrate in accordance with one embodiment of the present invention.

As shown in FIG. 6, an ion implantation process is performed to form buried conductive regions 42 in both the logic region 21 and the NVM region 23. In one embodiment, a p-type dopant, such as boron or indium, is used to form p-type buried conductive regions 42 if the top semiconductive layer 18 is silicon. Preferably, the p-type dopant is chosen to minimally diffuse in the semiconductor layer. A deep implantation process is performed so that the buried conductive regions 42 are not in contact with the top surface of the top semiconductor layer 18 and, in one embodiment, are in contact with the bottom surface of the top semiconductor layer 18. Thus, the implant energy may be chosen such that the projected range of the implanted ions is close to the bottom of the top semiconductor layer 18. The implant dose is chosen such as to form a conductive region 42 that has a sufficiently low resistivity to prevent the floating body effect. In one embodiment, a dosage of $8+10^{14}$ atoms/cm$^2$ of boron is implanted at an energy of 35 KeV for a top semiconductor layer 18 thickness of approximately 100 nanometers. Although FIG. 6 shows the buried conductive regions 42 to be formed in both the logic region 21 and the NVM region 23, they may not be formed in the logic region 21, as shown in FIG. 11, (i.e. the buried conductive regions 42 are optional in the logic region 21), because the floating body effect, which the presence of the buried conductive regions 42 eliminates, is more damaging to the NVM region 23 and therefore may be tolerable in the logic region 21. To prevent formation of buried conductive regions 42 in the logic region 21, this region may be masked (e.g. with photoresist) during the implantation process.

Figure 7:
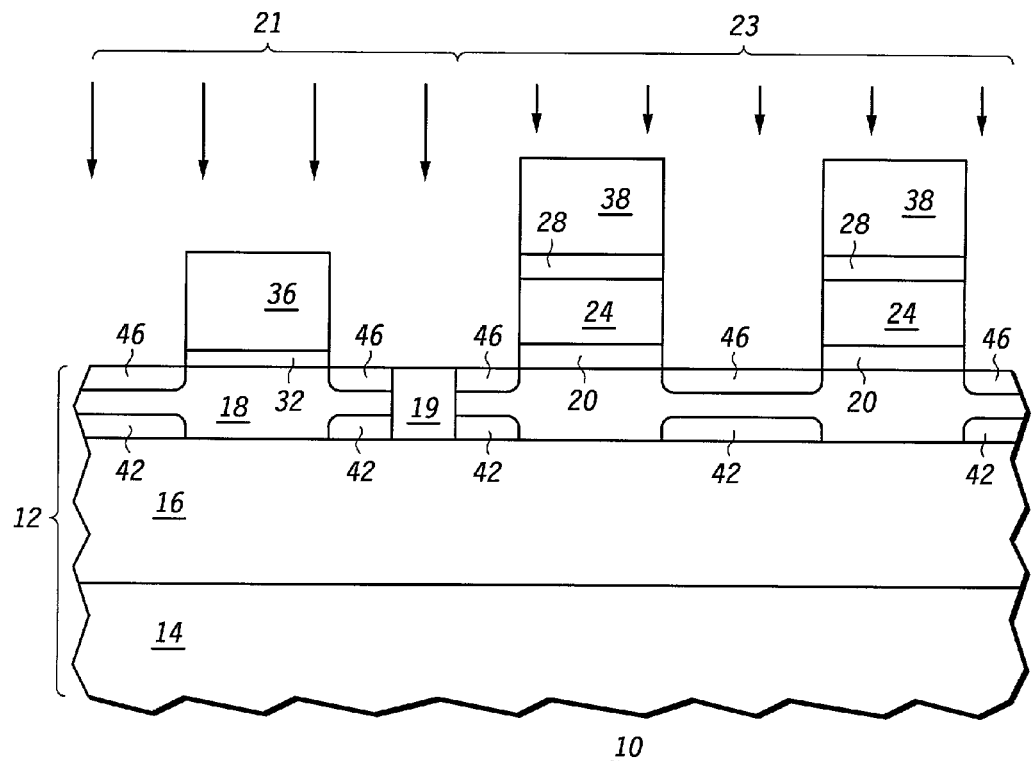

As shown in FIG. 7 after forming the buried contact regions 42, another ion implantation process is performed to form extension regions 46 in both the logic region 21 and the NVM region 23 of the semiconductor device 10. The dopant used should be chosen so that the extension regions 46 have a different conductivity than the buried conductive regions 42. In one embodiment, a dosage of $1 \times 10^5$ atoms/cm$^2$ of arsenic is implanted at an energy of 3 KeV. The extension regions 46 are in contact with the top surface of the top semiconductor layer 18 and are farther from the bottom surface of the top semiconductor layer 18 than the buried conductive regions 42. In other words, the buried conductive regions 42 are below the extension regions 46. In a preferred embodiment, the extension regions 46 are less than or equal to 50 nanometers in depth from the top surface of the top semiconductor layer 18. Although the extension regions 46 and the buried conductive regions 42 are shown not to abut each other (i.e. there is a gap between them), it is not necessary that they be separated from each other. However, the extensions 46 should not contact the bottom surface of the top semiconductor layer or more importantly, the top surface of the buried insulating layer 16 in the NVM region 23. In other words, in the NVM region 23 the buried conductive regions 42 should be vertically between the extension regions 46 and the buried insulating layer 16 or the bottom surface of the semiconductor layer 18. Since the buried conductive regions 42 are optional in the logic region 21, the extension regions 46 can be in contact with the buried insulating layer 16 (or the bottom surface of the semiconductor layer 18) in the logic region 21. Furthermore, each region of the extension regions 46 and the buried conductive regions 42, as shown in FIG. 7, are (physically) separated from each other.

Figure 8:
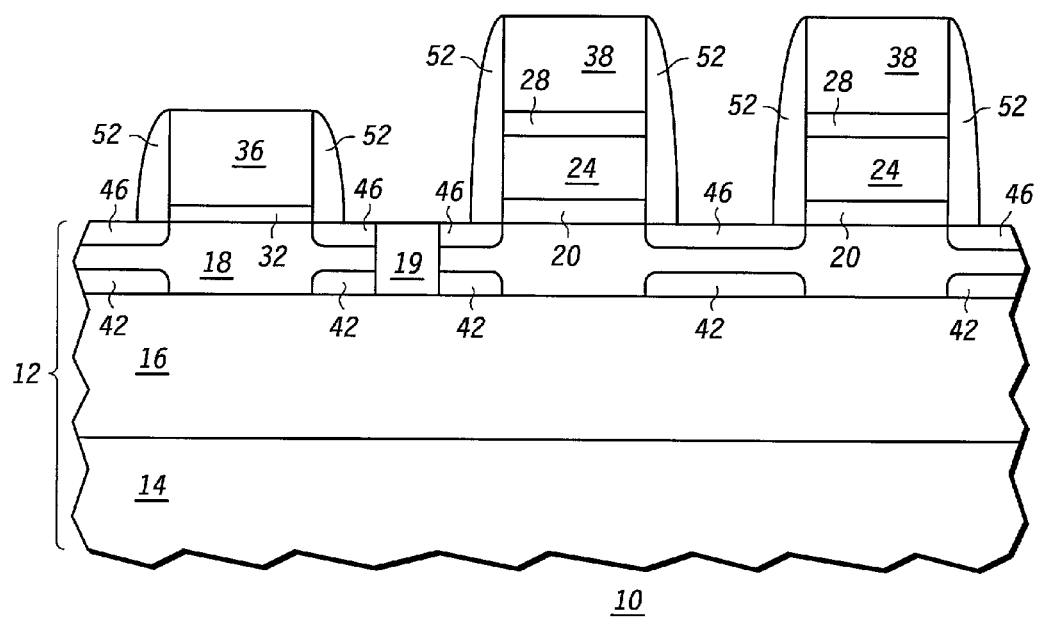
FIG. 8 illustrates the semiconductor substrate of FIG. 7 after forming spacers adjacent the gate stack and the memory stacks in accordance with an embodiment of the present invention.

After forming the extension regions 46, an insulating layer (not shown) is formed over the semiconductor device 10 by CVD, PVD, the like or combinations of the above, and anisotropically etched to form spacers 52 adjacent sidewalls of the logic stack 37 and the memory stacks 39, as shown in FIG. 8. Generally, the spacers will be a nitride material, such as silicon nitride.

Figure 9:
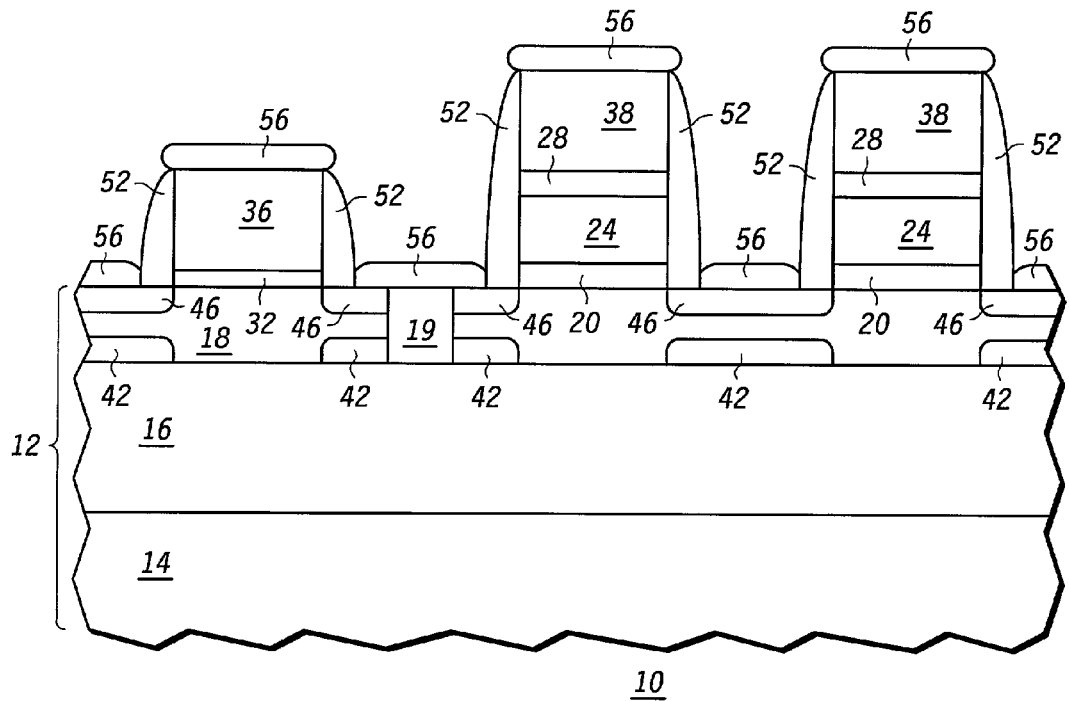
FIGS. 9–10 illustrate the semiconductor substrate of FIG. 8 while forming elevated source and drain regions adjacent the gate stack and the memory stack in accordance with an embodiment of the present invention.

As shown in FIG. 9, after forming the spacers 52, semiconductor regions 56 are formed by epitaxial growth and therefore are formed on all exposed silicon-containing areas. A precursor such as silicon tetrachloride ($SiCl_4$), trichlorosilane ($SiHCl_3$), dichlorosilane ($SiH_2Cl_2$), monosilane ($SiH_4$), disilane ($Si_2H_6$), the like or combinations of the above are used at deposition temperatures ranging from 400–1250 degrees Celsius (depending on the precursor) to form epitaxial semiconductor regions 56. A large excess amount of hydrogen may be added to serve as a reducing agent and/or a carrier gas. Since the epitaxial process is selective, meaning silicon will only form on areas that are silicon-containing, epitaxial semiconductor regions 56 will desirably form on exposed portions of the top semiconductor layer 18 and the gate electrode 36 and the control gates 38 if they contain silicon. The growth of the epitaxial semiconductor regions 56 on the gate electrode 36 and the control gates 38 is not needed, but does help reduce sheet resistance of the gate electrode 36 and the control gates 38.

In one embodiment, the semiconductor regions 56 are doped while being formed by adding dopants to the precursor gases. For example, diborane ($B_2H_6$), phosphine ($PH_3$) and arsine ($AsH_3$) can be used, depending on the conductivity desired. The conductivity chosen for the semiconductor regions 56 should be the same conductivity as the extension regions 46 and opposite the conductivity of the buried conductive regions 42.

Figure 10:
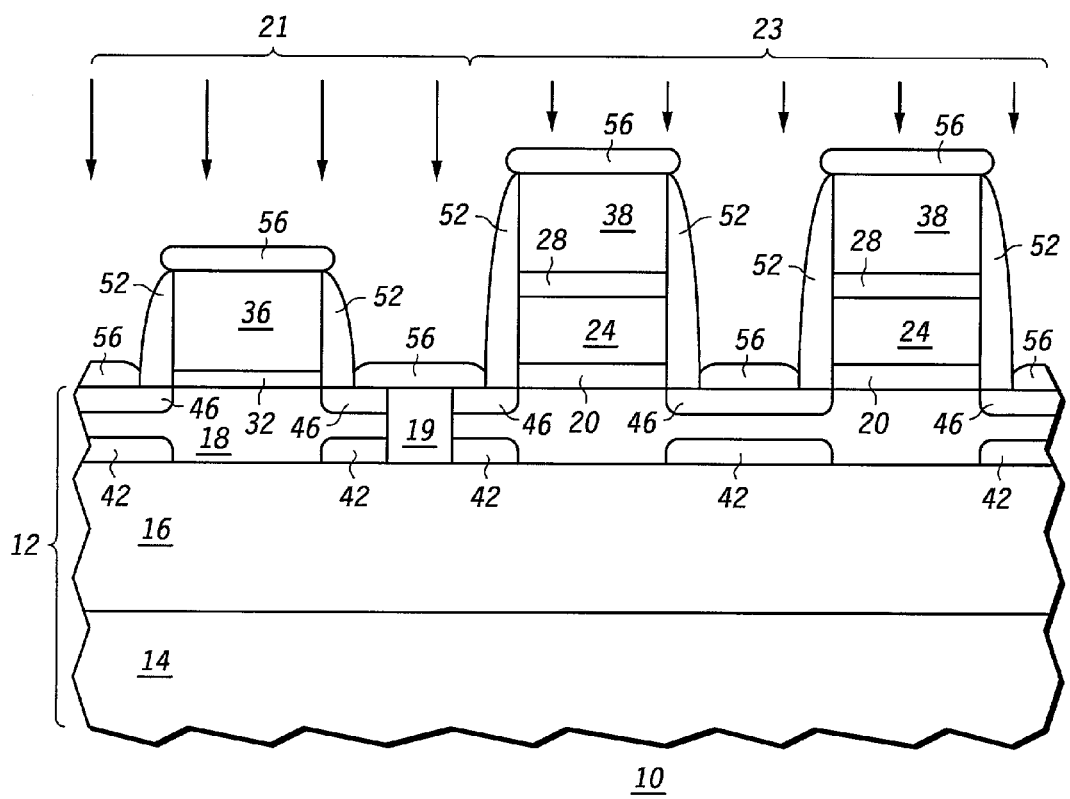

In another embodiment, an ion implantation is performed as shown in FIG. 10 to dope the epitaxial semiconductor regions 56, especially those overlying the extensions 46 in the top semiconductor layer 18. A dosage of $3 \times 10^{15}$ atoms/cm$^2$ of arsenic is implanted at an energy of 30 KeV to form n-type semiconductor regions 56 in one embodiment. Doping the semiconductor regions 56 by ion implantation is desirable because the gate electrode 36 and the control electrodes 38 are also desirably doped during the same process to lower sheet resistance.

After doping the semiconductor regions 56, an anneal is performed for a short duration of time in order to activate the dopants (i.e. incorporate the dopant into a material's lattice so that the dopant can donate an electron or hole to the material) in the semiconductor regions 56, the extension regions 46 and the buried conductive regions 42. For example, the anneal may be at a temperature of approximately 1000 degrees Celsius for 10–20 seconds. It is desirable to decrease the time and/or temperature of the anneal process in order to decrease the diffusion of the dopants, especially in the extension regions 46 and the buried conductive regions 42, so that the regions do not merge.

The (doped) semiconductor regions 56 are elevated source and drain extensions for the logic stack 37 and the memory stack 39. The semiconductor regions 56 are adjacent the sidewalls and spacers of the logic stack 37 and memory stacks 39, over the top semiconductor layer 18 and are in contact with the extension regions 46. In other words, at least a portion of the extension regions 46 are directly under the semiconductor regions 56. As a skilled artisan should recognize, channel regions are formed between the extension regions 46 underneath the logic stack 37 and memory stacks 39. Furthermore, a skilled artisan recognizes that the semiconductor regions 56 are separated from each other in order to serve as a source and drain regions.

After doping the semiconductor regions 56 processing is continued as known to one skilled in the art by depositing an interlevel dielectric (ILD), forming metal interconnects and forming contacts between metal interconnects and the gate electrode 36, the control electrode 38 and elevated source and drain regions 56 to form a finished device.

The presence of elevated sources and drains in the NVM region of the semiconductor device 10 allows for NVM devices to be easily integrated with logic devices that also have elevated sources and drains. By also having buried conductive regions the floating body effect is minimized so NVM devices can be formed on SOI substrates. In other words, NVM devices can be easily programmed using uniform channel programming techniques, HCI programming, or combinations thereof. In addition, erasing of the NVM devices through the channel region can be performed because the bias of the body can be controlled. For example, the bias can be split between the body and the control gate. Erase through application of a voltage between the control gate and the channel is also advantageous since it is a low power operation, imposing less demand on the high voltage circuitry necessary in NVM periphery. The described NVM devices are also advantageous because they are scalable, meaning that dimensions of the layers, doped regions and channel regions can be decreased proportionately as technology advances. Having buried conductive regions for some logic devices present in a technology is also desirable because logic devices suffer from the floating body effect as well. In addition, having the buried conductive regions of opposite conductivity type than the extension regions allows better controllability of the junction depth, hence improving short channel effects.

Although the invention has been described with respect to specific conductivity types, skilled artisans appreciated that conductivity types may be reversed. For example, the elevated source and drains and extensions may be p-type, the buried conductive regions 42 may be n-type, and the top semiconductor layer may be lightly doped n-type. In addition, it is possible to etch the tunnel dielectric and charge storing layers during the same process to eliminate processing steps (e.g. photolithographic and etch steps), thereby reducing cycle time and manufacturing costs. Similarly, the control dielectric can be etched while patterning the charge storing layer and/or the tunnel dielectric layer to reduce processing steps.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor device formed in a first semiconductor layer having a top surface and a bottom surface, wherein the semiconductor device comprises:
  a first semiconductor layer having a memory portion and a logic portion, wherein the logic portion is devoid of a fifth doped region opposite in conductivity to the fourth doped region and closer than the fourth conductive region to the bottom surface;
  a first dielectric layer over the memory portion of the first semiconductor layer;
  a conductive layer over the first dielectric layer;
  first conductive regions disposed laterally from the first dielectric layer and the conductive layer and over the first semiconductor layer;
  second conductive regions in the memory portion of the first semiconductor layer,
    wherein the second conductive regions are the same conductivity as the first conductive regions and are in contact with the top surface of the first semiconductor layer, wherein the second conductive regions are extension regions;
  third conductive regions in the memory portion of the first semiconductor layer, wherein the third conductive regions are opposite in conductivity to the second conductive regions and are closer than the second conductive regions to the bottom surface;
  a gate dielectric over the logic portion;
  a gate electrode over the gate dielectric;
  a third doped region laterally adjacent the gate dielectric and over the logic portion of the first semiconductor layer; and
  a fourth doped region in the logic portion of the first semiconductor layer, wherein the fourth doped region is the same conductivity as the third doped region, is within the first semiconductor layer, and at least a portion of the fourth doped region is directly under the third doped region.

2. The semiconductor device of claim 1 wherein each of the second conductive regions and each of the third conductive regions are physically separated from each other.

3. The semiconductor device of claim 1 further comprising a charge storage layer over the first dielectric layer and under the conductive layer; and wherein the first dielectric layer is a tunnel dielectric layer.

4. The semiconductor device of claim 3 wherein the charge storage layer is selected from the group consisting of a nitride layer and a polysilicon layer.

5. The semiconductor device of claim 3 wherein the charge storage layer comprises a plurality of nanocrystals.

6. The semiconductor device of claim 3 further comprising a second dielectric layer over the charge storage layer and under the conductive layer.

7. The semiconductor device of claim 6 wherein the second dielectric layer comprises an oxide-nitride-oxide stack.

8. The semiconductor device of claim 1 wherein the first conductive regions and the second conductive regions are n-type and the third conductive regions are p-type.

9. The semiconductor device of claim 1 further comprising a third dielectric layer under the first semiconductor layer.

10. The semiconductor device of claim 9 further comprising a second semiconductor layer under the third dielectric layer.

11. The semiconductor device of claim 10 wherein the first semiconductor layer, the third dielectric layer and the second semiconductor layer form a silicon-on-insulator substrate.

12. The semiconductor device of claim 1 wherein the first conductive regions are elevated source and drain regions and the second conductive regions are extension regions.

* * * * *